(12) United States Patent
Duggal et al.

(10) Patent No.: US 7,741,140 B2
(45) Date of Patent: Jun. 22, 2010

(54) METHODS, APPARATUS, AND ROLLERS FOR CROSS-WEB FORMING OF OPTOELECTRONIC DEVICES

(75) Inventors: Anil Raj Duggal, Niskayuna, NY (US); Hak Fei Poon, Downingtown, PA (US); Svetlana Rogojevic, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 215 days.

(21) Appl. No.: 12/017,142

(22) Filed: Jan. 21, 2008

(65) Prior Publication Data

US 2009/0186440 A1  Jul. 23, 2009

(51) Int. Cl.
*H01L 21/00* (2006.01)
(52) U.S. Cl. .................. 438/48; 257/E21.001; 101/481
(58) Field of Classification Search ............. 438/48; 257/E21.001; 101/481
See application file for complete search history.

(56) References Cited

U.S. PATENT DOCUMENTS

| | | | |
|---|---|---|---|
| 6,312,367 B1 | 11/2001 | Rogge | |
| 7,011,983 B2 | 3/2006 | Foust et al. | |
| 7,049,757 B2 | 5/2006 | Foust et al. | |
| 7,259,391 B2 | 8/2007 | Liu et al. | |
| 2005/0129977 A1 | 6/2005 | Poon et al. | |
| 2006/0202612 A1 | 9/2006 | Poon et al. | |
| 2007/0200489 A1* | 8/2007 | Poon et al. | 313/502 |

FOREIGN PATENT DOCUMENTS

| | | |
|---|---|---|
| CH | 342197 A | 11/1959 |
| EP | 0986112 A | 3/2000 |

OTHER PUBLICATIONS

Duggal et al., "Fault-Tolerant, Scalable Organic Light-Emitting Device Architecture," Applied Physics Letters, vol. 82, No. 16, pp. 2580-2582, Apr. 21, 2003.
Foust et al., pending U.S. Appl. No. 12/017,140, filed Jan. 21, 2008 entitled "Methods, Apparatus, and Rollers for Forming Optoelectronic Devices".
PCT International Search Report dated May 13, 2009.

* cited by examiner

*Primary Examiner*—Charles D Garber
*Assistant Examiner*—Stanetta D Isaac
(74) *Attorney, Agent, or Firm*—Mary Louise Gioeni (57) ABSTRACT

Apparatus and methods for forming optoelectronic devices such as an array of light emitting diodes or photovoltaic cells in one embodiment a roll-to-roll process in which a uniquely configured roller having a raised spiral coating surface is aligned with a plurality of first electrodes disposed on an angle on a substrate for coating a plurality of spaced-apart angled coated strips of optoelectronic materials along the cross-web direction of the substrate.

23 Claims, 9 Drawing Sheets fig. 1 fig. 2 fig. 5 fig. 6 fig. 7 fig. 8 fig. 9

WEB SPEED/ROLL SPEED = 1.0
*fig. 10*

WEB SPEED/ROLL SPEED = 0.5
*fig. 11*

WEB SPEED/ROLL SPEED = 0.2

*fig. 12*

TRANSITION ZONE FROM SPEED RATIO 1.0 TO 0.2

METHODS, APPARATUS, AND ROLLERS FOR CROSS-WEB FORMING OF OPTOELECTRONIC DEVICES

CROSS-REFERENCE TO RELATED APPLICATION

This application is related to commonly owned, and co-filed U.S. patent application Ser. No. 12/017,140, entitled "Methods, Apparatus, and Rollers For Forming Optoelectronic Devices" by Poon et al., which is hereby incorporated herein by reference in its entirety.

FIELD OF THE INVENTION

Embodiments of the present invention generally relate to optoelectronic devices. More particularly, embodiments of the present invention relate to forming optoelectronic devices and patterned films for large area optoelectronic devices such as light emitting diodes and photovoltaic devices.

BACKGROUND OF THE INVENTION

Organic electroluminescent devices (OLEDs) typically includes one or more light emitting layers disposed between two electrodes, e.g., a cathode and a light transmissive anode, formed on a light transmissive substrate. The light emitting layer emits light upon application of a voltage across the anode and cathode. Upon the application of a voltage from a voltage source, electrons are directly injected into the organic layer from the cathode, and holes are directly injected into the organic layer from the anode. The electrons and the holes travel through the organic layer until they recombine at a luminescent center. This recombination process results in the emission of a photon, i.e., light. Large area OLED devices typically combine many individual OLED devices on a single substrate or a combination of substrates with multiple individual OLED devices on each substrate. Applications for large area OLED devices include area lighting.

Electroluminescent layer patterning has been conventionally performed using stamping or laser ablation. In stamping, a pattern is imprinted upon the layer using mechanical force upon a patterned die or a stamping head, whereas in laser ablation, a patterned photomask covers the area to be patterned while the remaining area is selectively etched using a laser beam. Another approach includes inkjet printing.

A recent attempt for applying the patterned active electroluminescent layer is disclosed in U.S. Patent Application Publication No. 2005/0129977 by Poon et al., which includes a combination of a web coating using a roller having an elongated coating surface such as a micro gravure coating process and a solvent assisted wiping process for removing portions of the applied active electroluminescent web coated layer. U.S. Pat. No. 7,049,757 discloses an array of light devices connected in series.

Organic photovoltaic (OPV) devices may be fabricated using similar materials and concepts as the OLED devices. Organic photovoltaic (OPV) devices typically include at least two layers of organic semiconducting materials disposed between two conductors or electrodes. At least one layer of organic semiconducting material is an electron acceptor, and at least one layer of organic material is an electron donor. An electron acceptor is a material that is capable of accepting electrons from another adjacent material due to a higher electron affinity of the electron acceptor. An electron donor is a material that is capable of accepting holes from an adjacent material due to a lower ionization potential of the electron donor. The absorption of photons in an organic photoconductive material results in the creation of bound electron-hole pairs, which must be dissociated before charge collection can take place. The separated electrons and holes travel through their respective acceptor (semiconducting material) to be collected at opposite electrodes.

There is a need for further deposition and patterning techniques in the fabrication of organic electronic devices.

SUMMARY OF THE INVENTION

The present invention, in a first aspect, is directed to a method for forming a plurality of optoelectronic devices. The method includes providing a substrate having a longitudinal web direction and a cross-web direction, and a plurality of first electrodes disposed on the substrate to define a plurality of longitudinally-extending columns of spaced-apart first electrodes along the longitudinal web direction and a plurality of rows of spaced-apart first electrodes disposed on an angle relative to the cross-web direction. A first roller is provided having a first raised spiral coating surface extending around the first roller, and the substrate and the plurality of spaced-apart columns of the first electrodes aligned and passed relative to the first roller to deposit from the first raised spiral coating surface a first plurality of angled spaced-apart coated strips of a first optoelectronic material onto the substrate and onto the plurality of rows of first electrodes. A second roller is provided having a second raised spiral coating surface extending around the second roller, and the substrate, the plurality of spaced-apart columns of first electrodes, and the first plurality of angled spaced-apart coated strips of the first optoelectronic material is aligned and passed relative to the second roller to deposit from the second raised spiral coating surface a second plurality of angled spaced-apart coated strips of a second optoelectronic material onto the first plurality of angled spaced-apart coated strips of the first optoelectronic material. Portions of the deposited angled spaced-apart coated strips of the first optoelectronic material and the second optoelectronic material is removed between adjacent longitudinally-extending columns of the first electrodes and to expose portions of the longitudinally-extending columns of first electrode while other portions of the plurality of columns of first electrodes remain coated with the first optoelectronic material and the second optical material. A plurality of spaced-apart second electrodes is provided electrically coupling uncoated portions of the first electrodes with the coated portions disposed on adjacent first electrodes to form a plurality of angled rows of optoelectronic devices connected in series on an angle along the cross-web direction.

The present invention, in a second aspect, is directed to a method for forming a plurality of optoelectronic devices. The method includes providing a substrate having a longitudinal web direction and a cross-web direction, and a plurality of first electrodes disposed on the substrate to define a plurality of longitudinally-extending columns of spaced-apart first electrodes and a plurality of rows of spaced-apart first electrodes disposed on an angle relative to the cross-web direction. The substrate and the plurality of spaced-apart columns of first electrodes aligned and passed relative to a first roller means for depositing a first plurality of spaced-apart angled coated strips of a first optoelectronic material onto the substrate and onto the plurality of rows of first electrodes. The substrate, the plurality of spaced-apart columns of first electrodes, and the first plurality of angled coated strips of the first optoelectronic material aligned and passed relative to a second roller means for depositing a second plurality of angled coated strips of a second optoelectronic material onto the first plurality of angled spaced apart coated strips of the first optoelectronic material. Portions of the deposited angled coated strips of the first optoelectronic material and the second optoelectronic material between adjacent longitudinally-extending columns of the first electrodes are removed to expose portions of the longitudinally-extending columns of first electrode while other portions of the plurality of columns of first electrodes remain coated with the first optoelectronic material and the second optical material. A plurality of spaced-apart second electrodes is provided electrically coupling uncoated portions of the first electrodes with the coated portions disposed on adjacent first electrodes to form a plurality of angled rows of optoelectronic devices connected in series along the cross-web direction.

The present invention, in a third aspect, is directed to an apparatus for use in forming a plurality of optoelectronic devices. The apparatus includes a first roller means having a first raised spiral coating surface extending around the first roller for receiving a first optoelectronic material and depositing a plurality of longitudinally-extending angled strips of the first optoelectronic material, and first means for containing the first optoelectronic material and for receiving the raised spiral coating surface of the first roller means so that the raised spiral coating surface of the first roller is positionable in the first optoelectronic material.

The present invention, in a fourth aspect, is directed to a roller for use in forming a plurality of optoelectronic devices. The roller includes an elongated member means having a raised spiral coating surface extending around the roller for receiving a first optoelectronic material and depositing a plurality of longitudinally-extending angled strips of the first optoelectronic material.

BRIEF DESCRIPTION OF THE DRAWINGS

The subject matter which is regarded as the invention is particularly pointed out and distinctly claimed in the concluding portion of the specification. Aspects of the invention, however, may best be understood by reference to the following detailed description of various embodiments and the accompanying drawings in which:

DETAILED DESCRIPTION OF THE INVENTION

As described in greater detail below, aspects of the present invention are generally directed to methods, apparatus, and rollers for forming optoelectronic devices such as an array of light emitting diodes or photovoltaic cells using a roll-to-roll process in which a uniquely configured roller having a spiral coating surface is aligned with a plurality of first electrodes disposed on a substrate for coating a plurality of spaced-apart strips of an optoelectronic material along the cross-web direction of the substrate.

Figure 1:
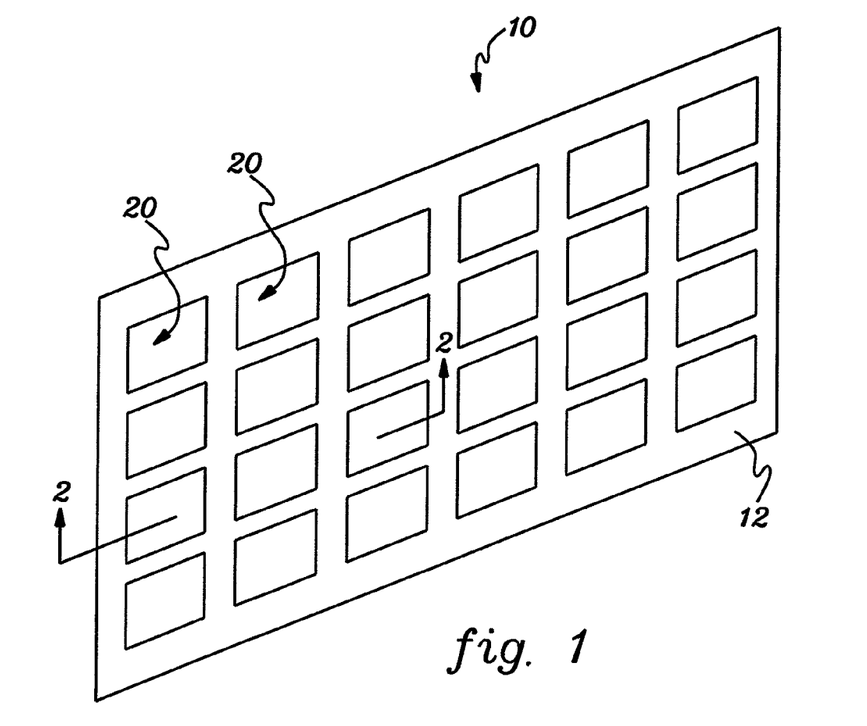
FIG. 1 is a top view of one embodiment of an array of optoelectronic devices fabricated in accordance with embodiments of the present invention.

Initially, with reference to FIG. 1, therein illustrated is an exemplary array 10 of optoelectronic devices 20 such as a plurality of light emitting diodes (OLEDs) supported on a substrate 12. The array may be configured for use as a large area lighting array. From the following description, it will be appreciated by those skilled in the art that other optoelectronic devices may be fabricated using the techniques in accordance with the present invention such as photovoltaic devices (OPVs). The array is patterned to provide a dense layer of discrete, electrically isolated patches or "elements." By patterning one or more layers of each discrete device 20, shorting between the top and bottom electrodes, as described below, will only affect the elements that are shorted, rather than shorting the entire array. In one embodiment, the size of the elements may be about ½-inch by about ½-inch. From the present description, it will be appreciated that other sizes and shapes of the elements may be suitably employed.

Figure 2:
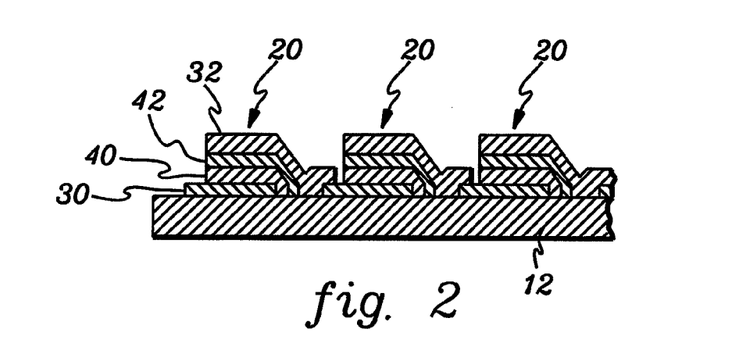
FIG. 2 is a cross-sectional view of a number of the optoelectronic devices taken in the direction of line 2-2 of FIG. 1.

As shown in FIG. 2, the optoelectronic devices 20 may be coupled in series. For example, the plurality of first electrodes 30 may be disposed and patterned on substrate 12 to form isolated structures. A first optoelectronic material 40 may be disposed on the plurality of first electrodes 30, and a second optoelectronic material 42 may be disposed on the first optoelectronic material 40. A plurality of second electrodes 32 may be disposed and patterned to provide an electrically conductive path to the first electrode 30 of an adjacent optoelectronic device in a single row of the array. As will be appreciated, by providing series connections for each of the adjacent devices in single row, a structure tolerant to electrical shorts (short-tolerant structure) is provided.

Figure 3:
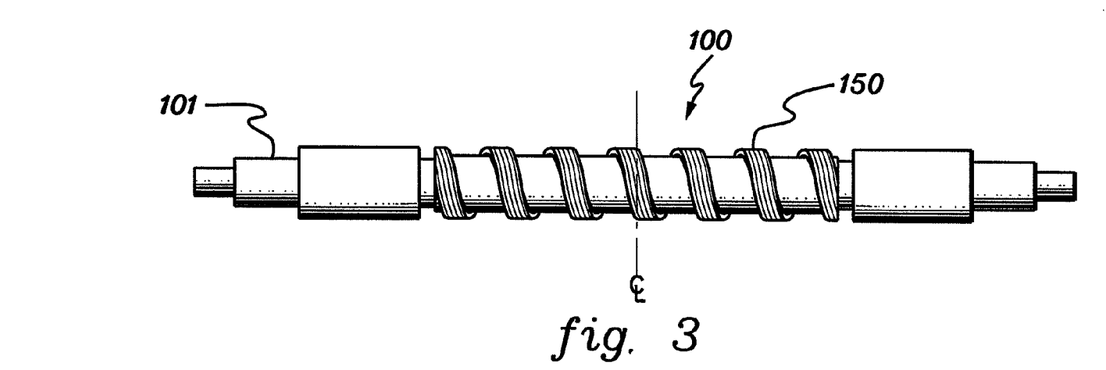
FIG. 3 is a side elevational view of one embodiment of a roller having a raised spiral coating surface in accordance with the present invention for use in forming the array of optoelectronic devices of FIG. 1.

As shown in FIG. 3, one embodiment of a roller 100 may include an elongated member 101 having a raised spiral coating surface 150 extending around the first roller from a first end of the roller to a second end of the roller for applying the layers of optoelectronic materials as described below. The coating surface may be an engraved surface engraved with patterns, cells or grooves which determine a finite volume of internal capacity, and may include an engraved roll ("gravure roll"). The geometry, number and spacing, depth or other features of the cells can be varied to produce a range of total volume to accomplish coating weight (thickness) control of the applied layers of optoelectronic materials. The raised coating surfaces may extend above a recessed surface of the roller about 0.06 inches although other dimensions may be suitably employed. The width of the coating surfaces may be about 0.25 inch or smaller to about 0.5 inch or greater. The spiral coating surface may also have a constant pitch from the first end of the first roller to a second end of the first roller. The coating surface may include a plurality of grooves or lines disposed on an angle relative to the axis of the roller and may include, for example, about 200 grooves or lines per inch.

Figure 4:
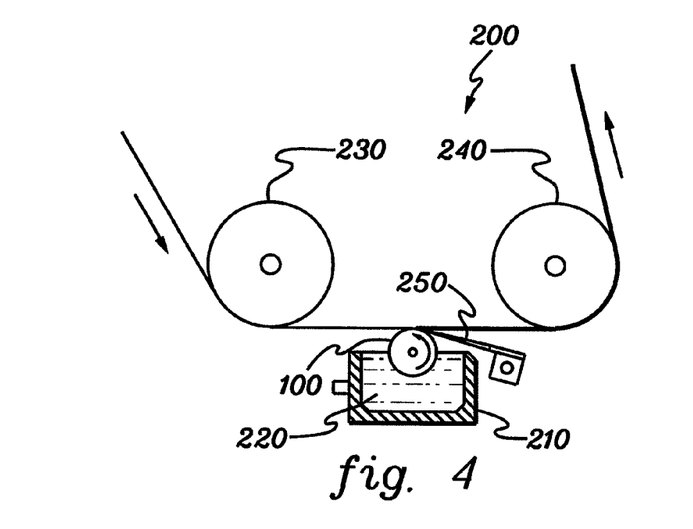
FIG. 4 is a simplified diagrammatic view of one embodiment of an apparatus in accordance with the present invention for depositing the optoelectronic materials used to form the optoelectronic devices of FIG. 1.

With reference to FIG. 4, one embodiment of an apparatus 200 for forming a plurality of optoelectronic devices may include roller 100 mounted on bearings (not shown) and rotated to be partially submerged in a reservoir 210 filled with a solution of liquid optoelectronic material 220 (a solid dissolved in a solvent) which is to be applied. Rollers 230 and 240 are configured to support the web of material to be processed over roller 100. As described in greater detail below, in accordance with embodiments of the present invention, the liquid optoelectronic material may comprise an active polymer material such as an light emitting polymer (LEP) or poly(3,4-ethylenedioxythiophene) (PEDOT) layer for forming an array of light emitting diodes.

Figure 5:
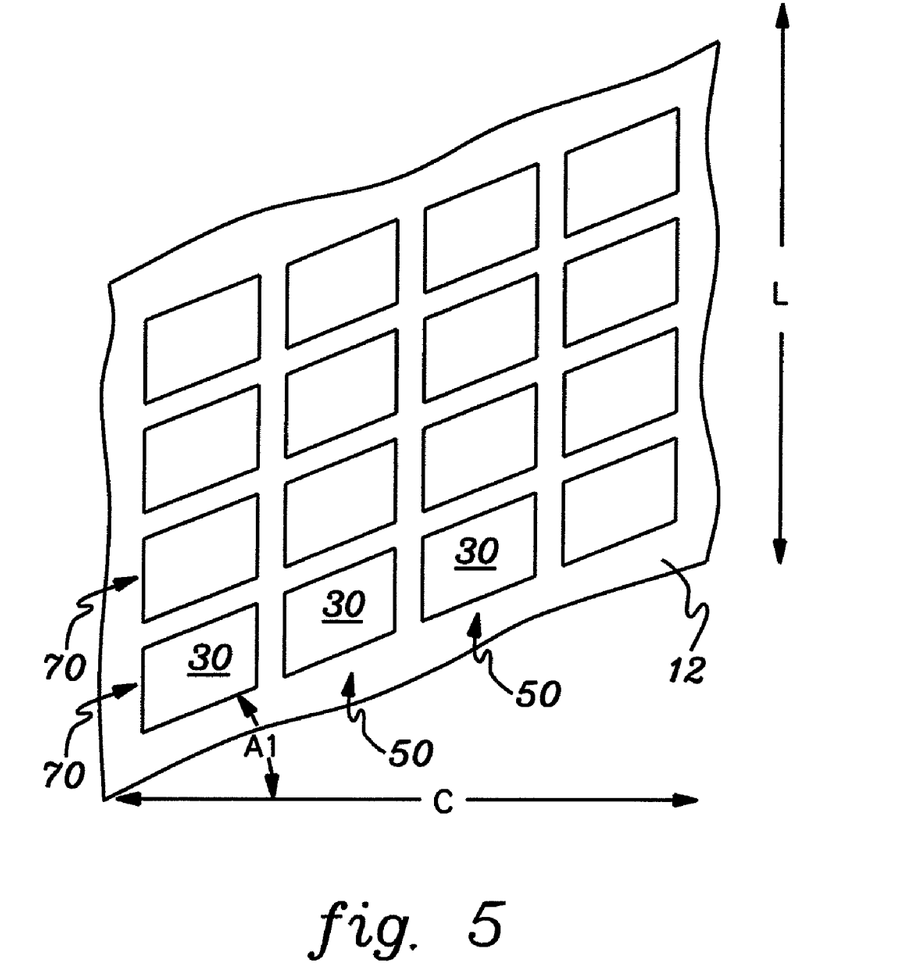
FIG. 5 is a top view of a portion of a substrate having a plurality of longitudinally-extending columns of spaced-apart first electrodes and a plurality of angled rows of spaced-apart first electrodes.

During fabrication, as initially shown in FIG. 5, one embodiment of a method for forming the plurality of optoelectronic devices 10, includes providing flexible substrate 12 having a longitudinal web direction L and a cross-web direction C having a plurality of first electrodes 30 disposed on the substrate to define a plurality of longitudinally-extending columns 50 of spaced-apart first electrodes along the longitudinal web direction and a plurality of rows 70 of spaced-apart first electrodes disposed on an angle A1 relative to the cross-web direction.

Figures 6, 7:
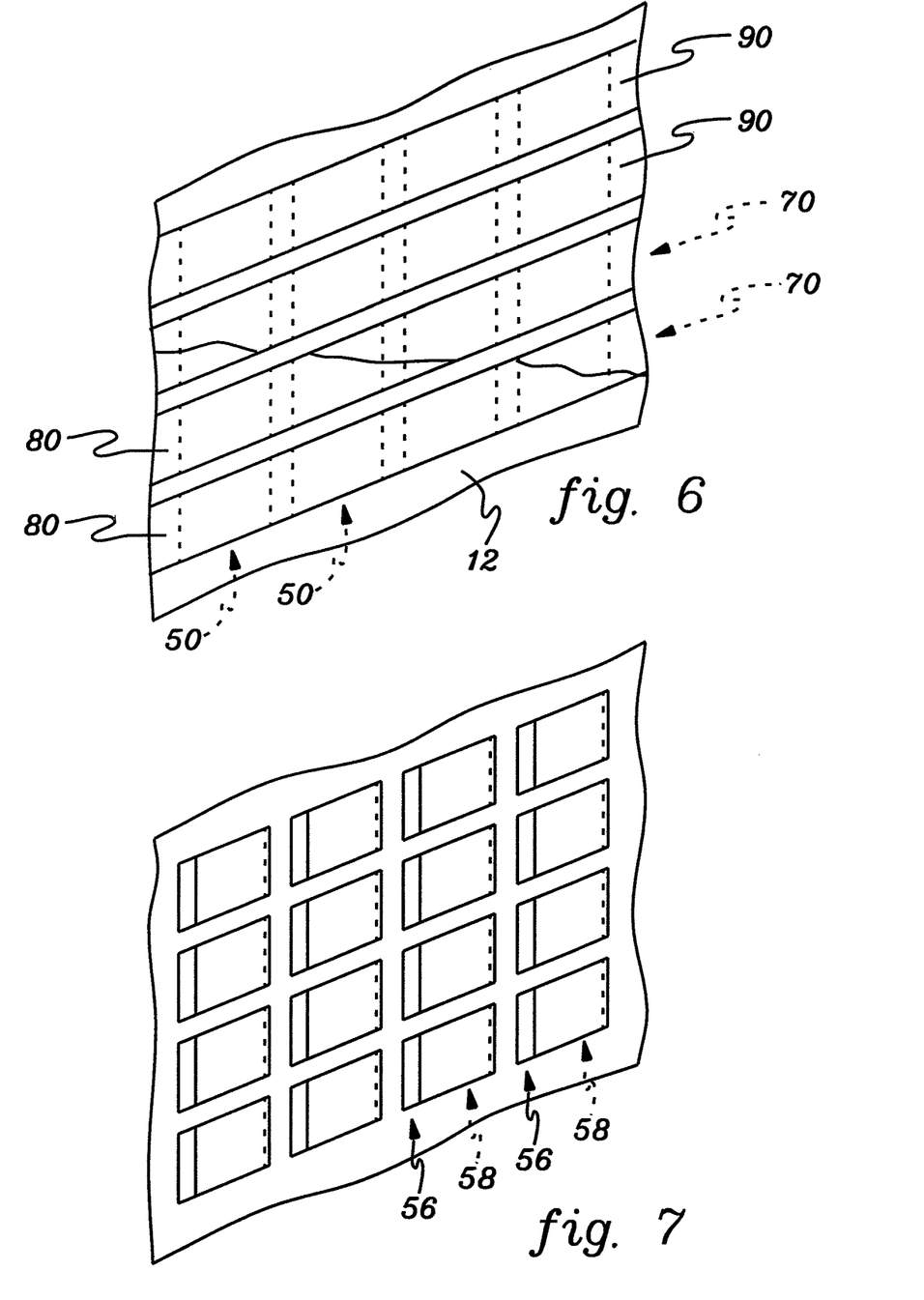
FIG. 6 is a top view of a portion of the substrate and a plurality of longitudinally-extending columns of spaced-apart first electrodes and a plurality of angled rows of spaced-apart first electrodes of FIG. 5 having a plurality of angled rows of the first and second optoelectronic materials deposited thereon.
FIG. 7 is a top view of a portion of the substrate, the plurality of spaced-apart first electrodes (portions of which shown in dashed lines), and the plurality of rows of the first and second optoelectronic materials deposited thereon of FIG. 6 with portions of the columns of the optoelectronic materials removed between adjacent columns of the first electrodes to expose portions of the longitudinally-extending columns of the first electrodes.

With reference to FIGS. 4-6, substrate 12 and the plurality of spaced-apart longitudinally-extending columns 50 of the first electrodes is aligned or registered with and passed relative to roller 100 to deposit or coat selectively from the raised spiral coating surface 150 of roller 100, as shown in FIG. 6, a first plurality of angled spaced-apart coated strips 80 of a first optoelectronic material from the reservoir onto substrate 12 and onto the plurality of rows 70 of first electrodes.

With reference again to FIG. 4, the substrate and plurality of first electrodes may be made to be spaced-apart from and not in direct physical contact with roller 100. Instead, the first optoelectronic material disposed on the coating surface of roller 100 may be made to contact the substrate and the plurality of first electrodes. A flexible steel blade 250 may be positioned to scrape excess optoelectronic material from the coating surfaces of roller 100 as roller 100 rotates toward the contact point of the substrate. Desirably, roller 100 is reverse-wiped across a moving tensioned reel-to-reel surface of the substrate having the plurality of columns of first electrode thereon. Use of a reverse coating results in a shearing force imparted onto the optoelectronic material as it is applied resulting in a generally uniform thin coated layer. It will be appreciated that forward or reverse coating may be employed.

Once the optoelectronic material has dried, for example in a drying chamber or the application of heat, apparatus 200 may be employed to coat a second optoelectronic material. For example, the contents of reservoir 210 may be replaced with a second optoelectronic material. Roller 100 having the raised spiral coating surface 150 may be dipped into the second optoelectronic material in the reservoir. The substrate, the plurality of spaced-apart longitudinally-extending columns of first electrodes, and the first plurality of spaced-apart angled coated strips of the first optoelectronic material is aligned and passed relative to roller 100 to deposit from the raised spiral coating surface, as shown in FIG. 6, a second plurality of angled spaced-apart coated strips 90 of a second optoelectronic material from the reservoir onto substrate 12 and onto the first plurality of angled spaced-apart coated strips 80. The angle A1 (FIG. 5) of the plurality of electrodes and the coated optoelectronic materials relative to the cross-web direction may range between about 10 degrees and about 80 degrees.

As shown in FIG. 7, the portions of the deposited spaced-apart longitudinally-extending coated strips 80 and 90 of the first optoelectronic material and the second optoelectronic material between adjacent columns 50 of the space-apart first electrodes is then removed to expose portions 56 of the longitudinally-extending columns of first electrode while other portions 58 of the plurality of columns of first electrodes remain coated with the first optoelectronic material and the second optoelectronic material. The removal of the portions of the deposited spaced-apart longitudinally-extending coated strips may include an etching process, wiping process, or other suitable process. For example, suitable solvent assisted wiping (SAW) processes are disclosed in U.S. Patent Application Nos. 2005/012997 by Poon et al. and 2006/0202612 by Poon et al., the entire contents of which are incorporated herein by reference.

Figure 8:
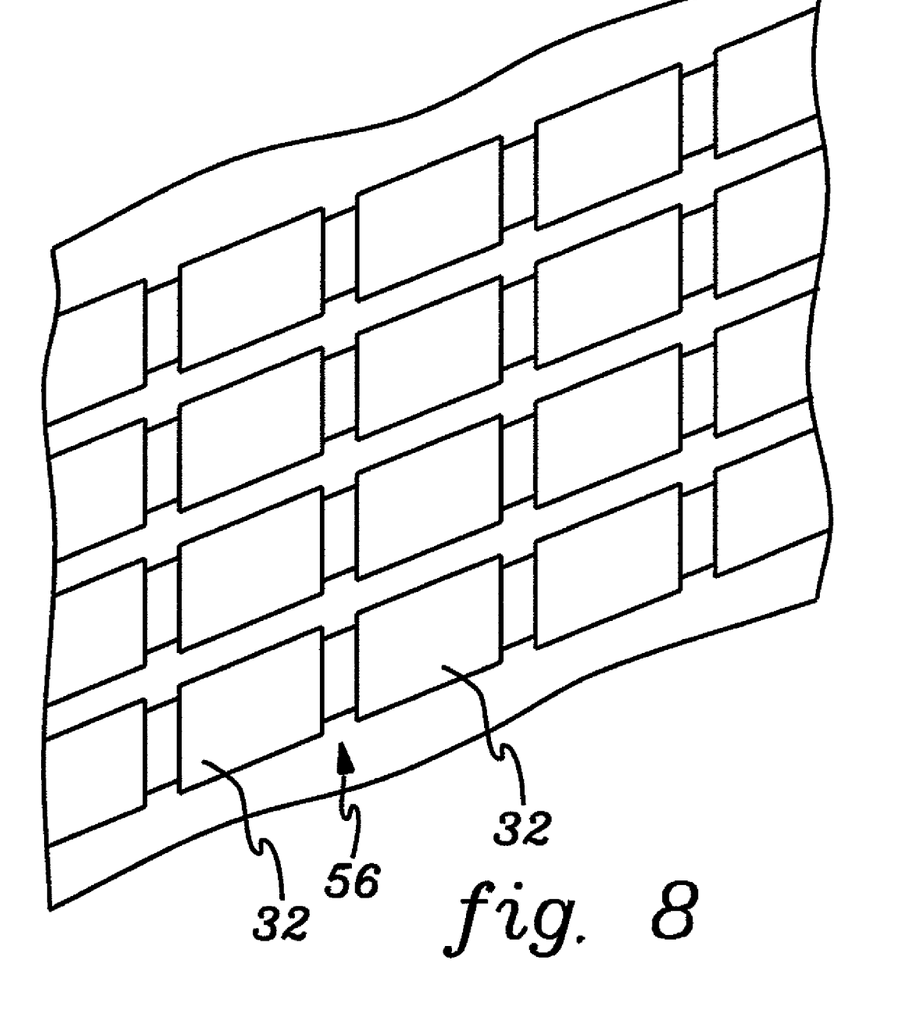
FIG. 8 is a top view of a portion of the substrate, the plurality of spaced-apart first electrodes, and the plurality of optoelectronic materials of FIG. 7, and a plurality of second electrodes deposited thereon.

Thereafter, as shown in FIG. 8, a plurality of spaced-apart second electrodes 32 is disposed electrically coupling uncoated portions 56 of the first electrodes with the coated portions disposed on adjacent first electrodes to form a plurality of angled rows of optoelectronic devices connected in series along the cross-web direction. The spaced-apart second electrodes may be deposed using a masking and deposition process such as evaporation or sputtering, or other suitable processes. The array of optoelectronic devises may be cut to a suitable size from the web, and the plurality of rows of serially electrically connected optoelectronic devices may further be electrically connecting in parallel, for example along the edges of the array.

Figure 9:
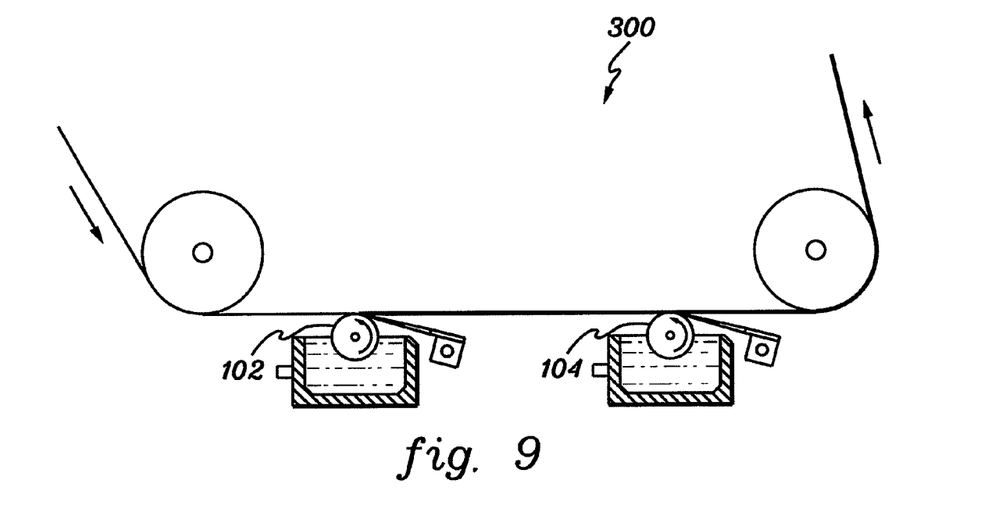
FIG. 9 is a simplified diagrammatic view of another embodiment of an apparatus in accordance with the present invention having a plurality of rollers for depositing the optoelectronic materials used to form the array of optoelectronic devices of FIG. 1.

FIG. 9 illustrates a second embodiment of an apparatus 300 that employs a first roller 102 and a second roller 104 which may be essentially the same roller 100 shown in FIG. 3 having a raised spiral coating surface for applying the aligned layers of optoelectronic materials. The optoelectronic materials may tend to spread once applied to the substrate, the first electrode, or the first applied optoelectronic material. Since the different optoelectronic materials may spread differently, the spacing between the coating surfaces may be sized differently depending on the optoelectronic material being applied. For example, PDOT has shown a spreading (on an edge from the coating surface) of about 125 microns while LEP has shown a spreading of about 250 microns.

Further, for forming a plurality of electroluminescent devices such as organic light emitting diodes, a plurality of second rollers (not shown), each having a having a raised spiral coating surface which are offset from each other allows depositing a second plurality of longitudinally-extending coated strips comprising different second electroluminescent materials from a plurality of separate reservoirs (not shown) onto the first plurality of longitudinally-extending coated strips. The different second electroluminescent materials may result in the plurality of electroluminescent devices operable to emit different colors of light. For example, different electroluminescent materials may be employed to produce an array of light emitting diodes having stripes of light emitting diodes of red, green, and blue. Desirably, a diffuser may be disposed adjacent to the array so that the red, green, and blue emitted colors are combined and are generally emitted as white light from the diffuser. From the present description, it will be appreciated that other approaches using aspects of the apparatus and methods of the present invention may be employed to produce emissions of generally white light.

Figure 10:
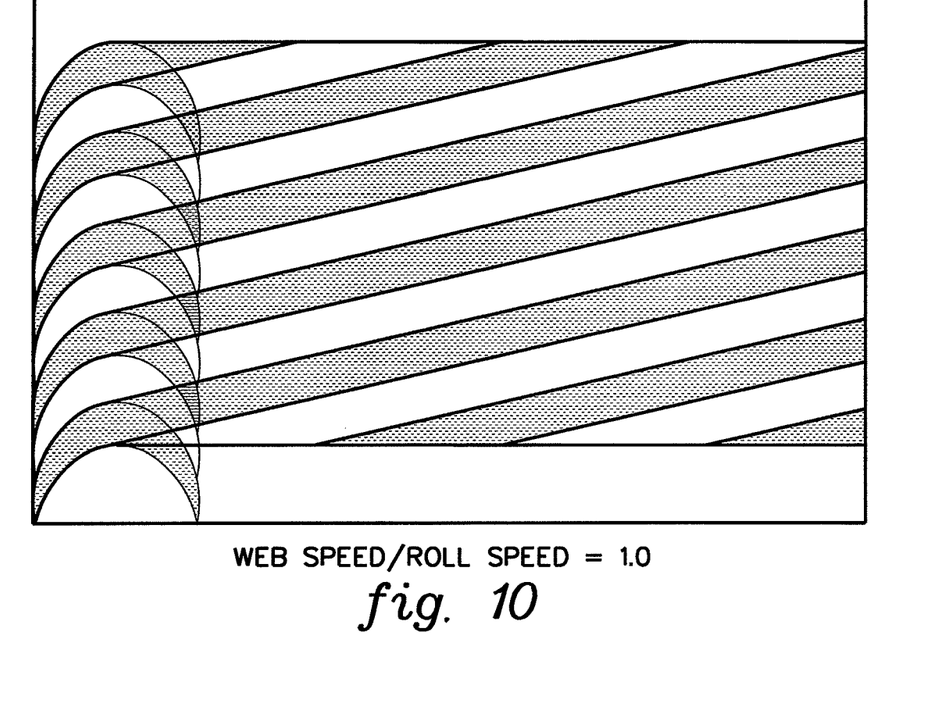
FIG. 10 is an illustration of the substrate and coated angled strips of optoelectronic material formed with the roller of FIG. 3 and in which the web speed to roll speed is equal to 1.
Figure 11:
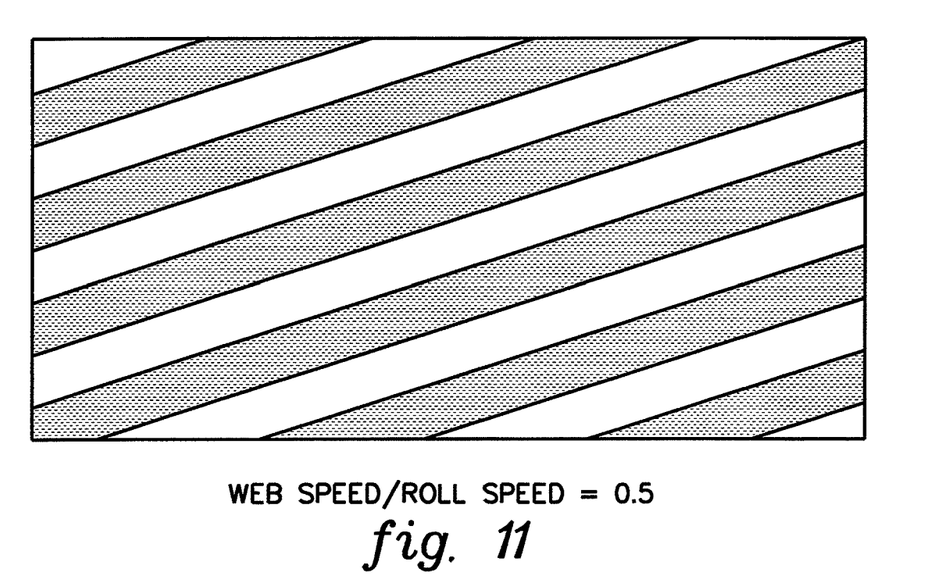
FIG. 11 is an illustration of the substrate and coated angled strips of optoelectronic material formed with the roller of FIG. 3 and in which the web speed to roll speed is equal to 0.5.
Figure 12:
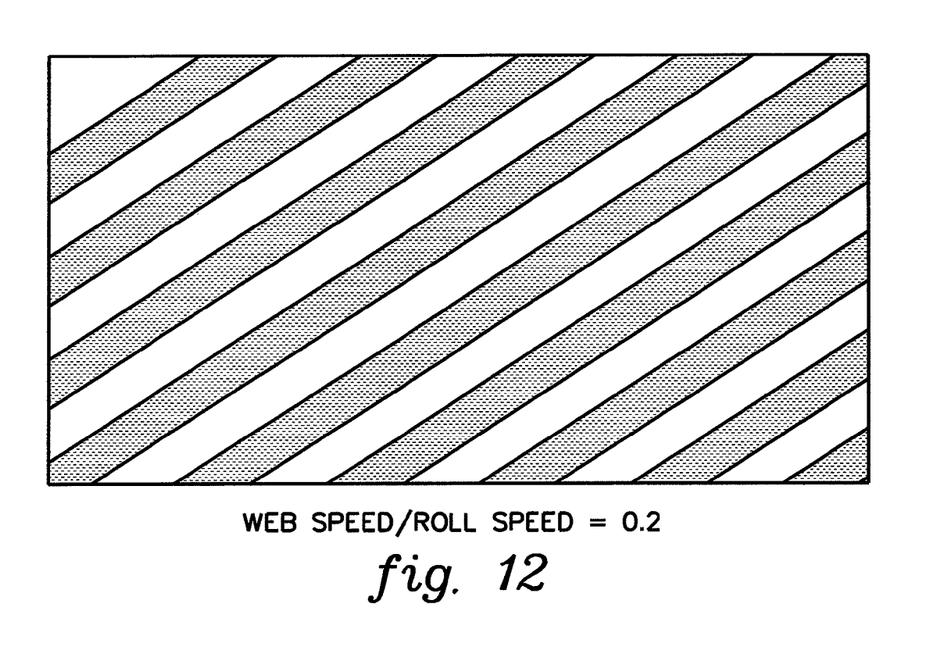
FIG. 12 is an illustration of the substrate and coated angled strips of optoelectronic material formed with the roller of FIG. 3 and in which the web speed to roll speed is equal to 0.2.
Figure 13:
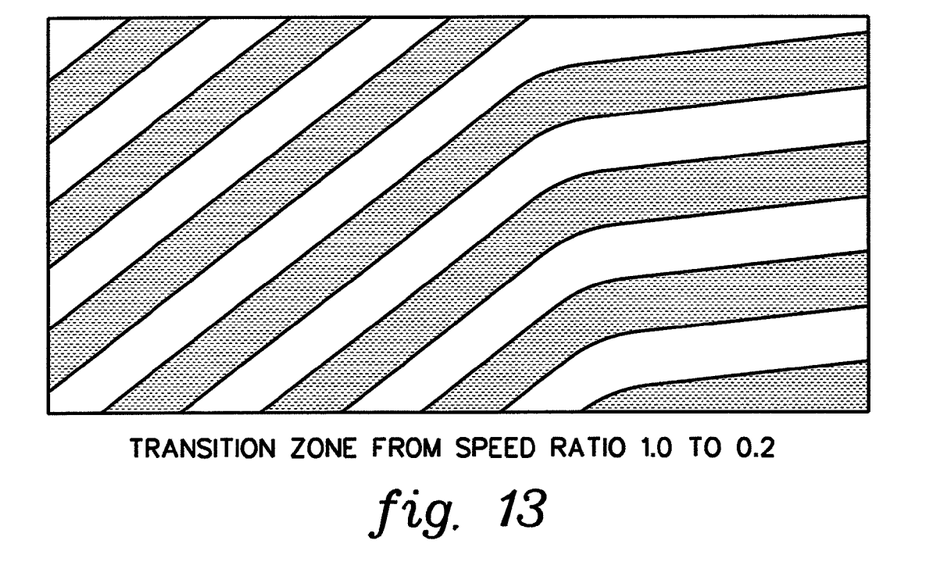
FIG. 13 is an illustration of the substrate and coated angled strips of optoelectronic material formed with the roller of FIG. 3 and in which the web speed to roll speed transitions form 1.0 to 0.2.

As will be appreciated from the present description, the angle of the coated strips of the first and second optoelectronic materials may be varied by adjusting the speed of the substrate and/or rotating speed of the roller. FIGS. 10-12 illustrate the effect of changing the ratio of the speed of the substrate compared to the speed of the roller from 1.0 to 0.2. FIG. 13 illustrates the applied angled coated strips during a transition from a ratio of 1.0 to 0.2.

Figure 14:
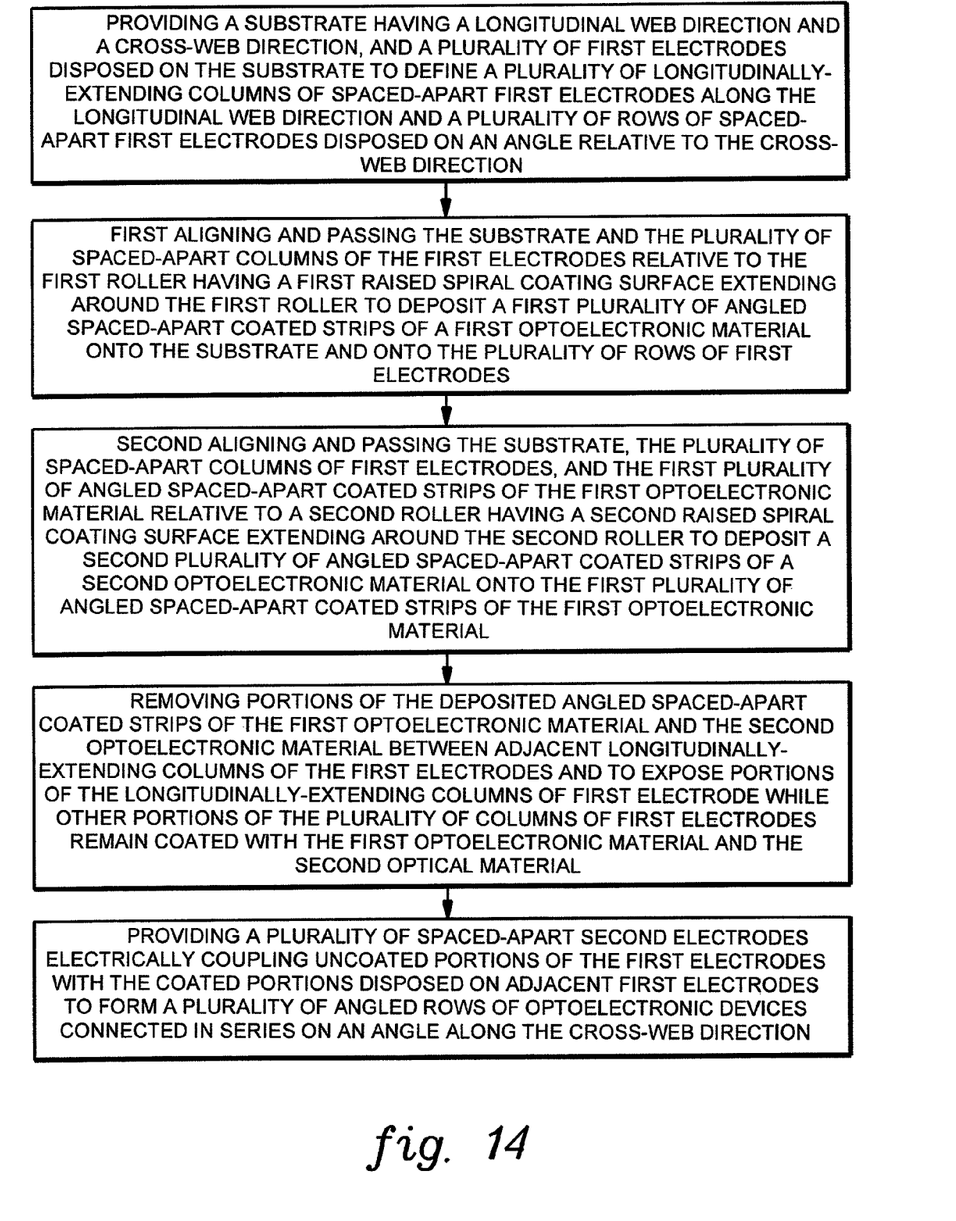
FIG. 14 is one embodiment of a flowchart of a method for forming the array of optoelectronic devices of FIG. 1.

Referring now to FIG. 14, a flowchart illustrates a process 400 for manufacturing an array of organic electronic devices in accordance with embodiments of the present invention.

In the various embodiments of the present invention, the flexible substrate may comprise any suitable material, such as polyethylene terepthalate (PET), polycarbonate (e.g., LEXAN), polymer material (e.g., MYLAR), polyester, or metal foil, for example. In some embodiments, the substrate comprises any material having a high melting point, thereby allowing for high processing temperatures (e.g., >200 degrees C.). Further, the substrate may be advantageously transparent and has a high rate of transmission of visible light (e.g., >85% transmission). Further, the substrate may advantageously comprise a material having a high impact strength, flame retardancy and thermoformability, for example.

The substrate may have a thickness in the range of approximately 1-125 mils. As can be appreciated, a material having a thickness of less than 10 mils (0.010 inch) may generally be referred to as a "film" while a material having a thickness of greater than 10 (0.010 inch) mils may generally be referred to as a "sheet." It should be understood that the substrate may comprise a film or a sheet. Accordingly, the use of either term herein is not meant to limit the thickness of the respective material, but rather, is provided for simplicity.

As previously described, the plurality of optoelectronic devices may be organic light emitting diodes (OLEDs), each of which may include a first electrode, active polymer optoelectronic layers, and a second electrode. The first electrode may be configured to form the anode of the OLED and may comprise a transparent conductive oxide (TCO), such as indium-tin-oxide (ITO), for example. The transparent ITO may be disposed on the flexible transparent substrate using roll-to-roll processing techniques. For instance, the first electrode may be disposed by sputtering techniques to achieve a thickness in the range of approximately 50-250 nanometers, for example. The first electrode preferably has a light transmission ratio of at least 0.8. The second electrode is configured to form the cathode and may comprise an aluminum film with a cathode activator NaF, for instance. Alternatively, the second electrode may comprise calcium, magnesium or silver, for example. As with the first electrode, the second electrode may be disposed using sputtering techniques to achieve a thickness in the range of 50-250 nanometers, for example. For bottom-emitting OLED devices, the second electrode is advantageously reflective to reflect impinging light toward the front of the device where it can be coupled to the ambient environment. As will be appreciated, when a voltage potential is produced across the first electrode and the second electrode, light is emitted from the active polymer layers. Alternatively, both electrodes may be transparent, to enable a transparent light-emitting device, or the bottom electrode may be reflective, and the top electrode transparent, in the case of a top-emitting OLED.

As previously described, a number of active polymer layers may be disposed between the first electrode and the second electrode. As can be appreciated, for an OLED device, the active polymer layers may comprise several layers of organic light-emitting polymers, such as a polyphenylene vinylene or a polyfluorene, typically from a xylene solution. The number of layers and the type of organic polymers disposed will vary depending on the application, as can be appreciated by those skilled in the art. In one exemplary embodiment of an OLED device, one active polymer layer may comprise a light emitting polymer (LEP) such as polyfluorene, and the other active polymer layer may comprise a hole transport layer such as poly(3,4)-ethylendioxythiophene/polystyrene sulfonate (PEDOT/PSS). As will be appreciated, other light emitting polymers and hole transport or electron transport layers may be employed. Further, additional active polymer layers may be employed in the OLED device.

If the optoelectronic device is, for example, an organic photovoltaic (OPV) device, the types of organic materials used for the active polymer layers may be different from those described above with reference to the OLED devices. An organic PV device comprises one or more layers that enhance the transport of charges to the electrodes. For example, in an OPV device, the active polymer layers may include an electron donor material and an electron acceptor material. The electron donor layer may comprise metal-free phthalocyanine; phthalocyanine pigments containing copper, zinc, nickel, platinum, magnesium, lead, iron, aluminum, indium, titanium, scandium, yttrium, cerium, praseodymium, lanthanum, neodymium, samarium, europium, gadolinium, terbium, dysprosium, holmium, erbium, thulium, ytterbium, and lutetium; quinacridone pigment; indigo and thioindigo pigments; merocyanine compounds; cyanine compounds; squarylium compounds; hydrazone; pyrazoline; triphenylmethane; triphenylamine; conjugated electroconductive polymers, such as polypyrrole, polyaniline, polythiophene, polyphenylene, poly(phenylene vinylene), poly(thienylene vinylene), poly(isothianaphthalene); and poly(silane), for instance. Further, the electron donor material may also include a hole transport material, such as triaryldiamine, tetraphenyldiamine, aromatic tertiary amines, hydrazone derivatives, carbazole derivatives, triazole derivatives, imidazole derivatives, oxadiazole derivatives having an amino group, and polythiophene, for instance.

The electron acceptor material in an OPV device may include perylene tetracarboxidiimide, perylene tetracarboxidiimidazole, anthraquinone acridone pigment, polycyclic quinone, naphthalene tetracarboxidiimidazole, CN- and CF3-substituted poly(phenylene vinylene), and Buckminsterfullerene, for instance. Further, the electron acceptor material may also include an electron transport material, such as metal organic complexes of 8-hydroxyquinoline; stilbene derivatives; anthracene derivatives; perylene derivatives; metal thioxinoid compounds; oxadiazole derivatives and metal chelates; pyridine derivatives; pyrimidine derivatives;

quinoline derivatives; quinoxaline derivatives; diphenylquinone derivatives; nitro-substituted fluorine derivatives; and triazines, for example.

As noted above in connection with the forming of the array of optoelectronic devices, the coated layers of the optoelectronic material are removed between adjacent rows of the optoelectronic devices. In accordance with embodiments of the present invention, a solvent assisted wiping (SAW) technique may be implemented to pattern the columns of coated layers of the optoelectronic materials. As will be appreciated, SAW techniques facilitate the removal of material over a selected area by solvating a portion of the material, such as a portion of the columns of coated layers of the optoelectronic materials by at least one of water, methanol, ethanol, isopropanol, acetone, toluene, xylene, or combinations thereof. The surface of the solvated portion of the layers is then wiped by a wiping head to remove a portion of one or both of the layers, thereby patterning the layers. It will be appreciated that in certain embodiments of the present invention, one of the active polymer layers is disposed and patterned before the other active polymer layer is disposed and patterned. Alternatively, the active polymer layers may be disposed and subsequently patterned simultaneously. In one embodiment of the invention, the solvating species are selected for removing a single layer with each wiping action without damaging underlying layers. In this exemplary embodiment, one active polymer layer may be disposed and then patterned. Next, the other layer may be disposed and then patterned. The solvent used to pattern each layer will be different depending on the material of the layer being patterned. For example, an OLEP layer in a two-layer structure can be patterned using xylene as a solvent without damaging a PEDOT layer underneath.

In another embodiment, the solvating species are selected to facilitate removal of multiple active polymer layers with each wiping. That is, both active polymer layers may be disposed and then both active polymer layers may be patterned simultaneously. In typical instances, one active polymer layer comprises a conductive polymer coating, such as PEDOT, which is very polar and dissolves only in hydrogen-bonding solvents like water. The active polymer layer may comprise an LEP material that is non-polar, which dissolves only in non-polar solvents such as toluene or xylene. In order to remove multiple polymer coatings having extremely divergent solubility characteristics in a single wipe, suitable solvents for each polymer are dispersed in a third solvent to produce a homogeneous solution. The third, or dispersing, solvent is selected from a number of solvents, such as, but not limited to, alcohols (such as isopropanol, ethanol, methanol, and the like), ketones (such as acetone, methyl ethyl ketone, and the like), acetates, ethers, methylene chloride, or any solvent having intermediate solubility parameters. In this embodiment, two active polymer layers can also be removed in one step with a solvent system containing water and xylene. In this particular embodiment, isopropanol is used to facilitate mixing of water and xylene to yield a homogeneous solution.

The wiping head may generally comprise at least one of a sponge, elastomer, thermoplastic, thermoset, fiber mat, porous material, polyurethane rubber, synthetic rubber, natural rubber, silicones, polydimethylsiloxane (PDMS), textured materials, and combinations thereof. Further, the wiping head may have any desirable profile to achieve the desired patterning of the underlying layer.

Embodiments of the rollers of the present invention may be solid and formed from an integral, monolithic, or one-piece construction. Further, from the present description, the optoelectronic materials may be polymers, as well as small molecules, dendrimers, etc.

Thus, while various embodiments of the present invention have been illustrated and described, it will be appreciated to those skilled in the art that many changes and modifications may be made thereunto without departing from the spirit and scope of the invention.

The invention claimed is:

1. A method for forming a plurality of optoelectronic devices, the method comprising:
   providing a substrate having a longitudinal web direction and a cross-web direction, and a plurality of first electrodes disposed on the substrate to define a plurality of longitudinally-extending columns of spaced-apart first electrodes along the longitudinal web direction and a plurality of rows of spaced-apart first electrodes disposed on an angle relative to the cross-web direction;
   providing a first roller having a first raised spiral coating surface extending around the first roller;
   first aligning and passing the substrate and the plurality of spaced-apart columns of the first electrodes relative to the first roller to deposit from the first raised spiral coating surface a first plurality of angled spaced-apart coated strips of a first optoelectronic material onto the substrate and onto the plurality of rows of first electrodes;
   providing a second roller having a second raised spiral coating surface extending around the second roller;
   second aligning and passing the substrate, the plurality of spaced-apart columns of first electrodes, and the first plurality of angled spaced-apart coated strips of the first optoelectronic material relative to the second roller to deposit from the second raised spiral coating surface a second plurality of angled spaced-apart coated strips of a second optoelectronic material onto the first plurality of angled spaced-apart coated strips of the first optoelectronic material;
   removing portions of the deposited angled spaced-apart coated strips of the first optoelectronic material and the second optoelectronic material between adjacent longitudinally-extending columns of the first electrodes and to expose portions of the longitudinally-extending columns of first electrode while other portions of the plurality of columns of first electrodes remain coated with the first optoelectronic material and the second optical material; and
   providing a plurality of spaced-apart second electrodes electrically coupling uncoated portions of the first electrodes with the coated portions disposed on adjacent first electrodes to form a plurality of angled rows of optoelectronic devices connected in series on an angle along the cross-web direction.

2. The method of claim 1 further comprising varying the angle of the deposited plurality of angled coated strips by adjusting at least one of a speed of rotation of the first and second rollers and a speed of the substrate.

3. The method of claim 1 further comprising varying the angle of the deposited plurality of angled coated strips by adjusting a speed of rotation of the first and second rollers and a speed of the substrate.

4. The method of claim 1 wherein the first raised spiral coating surface comprises a constant pitch from the first end of the first roller to a second end of the first roller.

5. The method of claim 1 wherein the first raised spiral coating surface comprises a varying pitch from the first end of the first roller to a second end of the first roller.

6. The method of claim 1 wherein the providing the second roller comprises using the first roller.

7. The method of claim 1 wherein the plurality of first electrodes comprises a plurality of parallelogram-shaped first electrodes.

8. The method of claim 1 further comprising maintaining a constant angle of the angled coated strips.

9. The method of claim 1 wherein the raised spiral coating surfaces comprises at least one of a plurality of cells and grooves.

10. The method of claim 1 wherein the second aligning and passing comprises aligning and passing the substrate, the plurality of columns of first electrodes, and the first plurality of angled coated strips relative to the second roller comprising a plurality of second rollers having a plurality of offset spiral raised coating surfaces to deposit the second plurality of coated strips comprising different second optoelectronic materials from a plurality of reservoirs onto the first plurality of angled coated strips, and wherein the different second optoelectronic materials result in the plurality of optoelectronic devices operable to emit different colors of light.

11. The method of claim 1 wherein at least one of the first optoelectronic material and the second optoelectronic material comprises an electroluminescent material, and the plurality of optoelectronic devices comprise a plurality of electroluminescent devices.

12. The method of claim 1 wherein at least one of the first optoelectronic material and the second optoelectronic material comprise a light-absorbing material, and the plurality of optoelectronic devices comprise a plurality of photovoltaic devices.

13. The method of claim 1 further comprising electrically connecting in parallel the plurality of rows of serially electrically connected optoelectronic devices.

14. A method for forming a plurality of optoelectronic devices, the method comprising:
 providing a substrate having a longitudinal web direction and a cross-web direction, and a plurality of first electrodes disposed on the substrate to define a plurality of longitudinally-extending columns of spaced-apart first electrodes and a plurality of rows of spaced-apart first electrodes disposed on an angle relative to the cross-web direction;
 first aligning and passing the substrate and the plurality of spaced-apart columns of first electrodes relative to a first roller means for depositing a first plurality of spaced-apart angled coated strips of a first optoelectronic material onto the substrate and onto the plurality of rows of first electrodes;
 second aligning and passing the substrate, the plurality of spaced-apart columns of first electrodes, and the first plurality of angled coated strips of the first optoelectronic material relative to a second roller means for depositing a second plurality of angled coated strips of a second optoelectronic material onto the first plurality of angled spaced apart coated strips of the first optoelectronic material;
 removing portions of the deposited angled coated strips of the first optoelectronic material and the second optoelectronic material between adjacent longitudinally-extending columns of the first electrodes and to expose portions of the longitudinally-extending columns of first electrode while other portions of the plurality of columns of first electrodes remain coated with the first optoelectronic material and the second optical material; and
 providing a plurality of spaced-apart second electrodes electrically coupling uncoated portions of the first electrodes with the coated portions disposed on adjacent first electrodes to form a plurality of angled rows of optoelectronic devices connected in series along the cross-web direction.

15. The method of claim 14 further comprising varying the angle of the deposited plurality of angled coated strips by adjusting at least one of a speed of rotation of the first and second roller means and a speed of the substrate.

16. The method of claim 14 further comprising varying the angle of the deposited plurality of angled coated strips by adjusting a speed of rotation of the first and second roller means and a speed of the substrate.

17. The method of claim 14 further comprising maintaining a constant angle of the angled coated strips.

18. The method of claim 14 wherein the second roller means comprises using the first roller means.

19. The method of claim 14 wherein the plurality of first electrodes comprises a plurality of parallelogram-shaped first electrodes.

20. The method of claim 14 wherein the second aligning and passing comprises aligning and passing the substrate, the plurality of columns of first electrodes, and the first plurality of angled spaced-apart coated strips relative to the second roller means comprising a plurality of second roller means to deposit the second plurality of coated strips comprising different second optoelectronic materials a plurality of separate reservoirs onto the first plurality of angled coated strips, and wherein the different second optoelectronic materials result in the plurality of optoelectronic devices operable to emit different colors of light.

21. The method of claim 14 wherein at least one of the first optoelectronic material and the second optoelectronic material comprises an electroluminescent material, and the plurality of optoelectronic devices comprise a plurality of electroluminescent devices.

22. The method of claim 14 wherein at least one of the first optoelectronic material and the second optoelectronic material comprise a light-absorbing material, and the plurality of optoelectronic devices comprise a plurality of photovoltaic devices.

23. The method of claim 14 further comprising electrically connecting in parallel the plurality of rows of serially electrically connected optoelectronic devices.

* * * * *